United States Patent
Yu et al.

(10) Patent No.: US 10,175,727 B2
(45) Date of Patent: *Jan. 8, 2019

(54) ELECTRIC SHOCK PROTECTION DEVICE AND MOBILE ELECTRONIC APPARATUS INCLUDING THE SAME

(71) Applicant: AMOTECH CO., LTD, Incheon (KR)

(72) Inventors: Jun-Suh Yu, Incheon (KR); Kyu Hwan Park, Yongin-si (KR); Tong Gi Kim, Yongin-si (KR); Gui Nam Sun, Incheon (KR); Jae Su Ryu, Seoul (KR); Byung Guk Lim, Incheon (KR); Rieon Kim, Incheon (KR)

(73) Assignee: AMOTECH CO., LTD., Incheon (KR)

( * ) Notice: Subject to any disclaimer, the term of this patent is extended or adjusted under 35 U.S.C. 154(b) by 48 days.

This patent is subject to a terminal disclaimer.

(21) Appl. No.: 14/885,554

(22) Filed: Oct. 16, 2015

(65) Prior Publication Data

US 2016/0149399 A1 May 26, 2016

(30) Foreign Application Priority Data

Nov. 20, 2014 (KR) .................. 10-2014-0162808
Nov. 20, 2014 (KR) .................. 10-2014-0162863
Jul. 1, 2015 (KR) .................. 10-2015-0094264

(51) Int. Cl.
*H02H 9/02* (2006.01)
*G06F 1/16* (2006.01)
(Continued)

(52) U.S. Cl.
CPC ........ *G06F 1/1656* (2013.01); *H01L 27/0288* (2013.01); *H02H 9/046* (2013.01); *H05K 1/0257* (2013.01)

(58) Field of Classification Search
CPC ........ H02H 9/02; H02H 9/046; G06F 1/1656; H01L 27/0288; H05K 1/0257
(Continued)

(56) References Cited

U.S. PATENT DOCUMENTS

2012/0300355 A1* 11/2012 Umeda ................ H05K 9/0067
361/220
2013/0057994 A1* 3/2013 Youn ........................ H02H 9/00
361/56

FOREIGN PATENT DOCUMENTS

JP 2005505188 A 2/2005
JP 2010146779 A * 7/2010
(Continued)

OTHER PUBLICATIONS

Machine translation of Tokunaga et al. Japanese Patent Document 2010-146779 A, Jul. 1, 2010.*

*Primary Examiner* — Kevin J Comber
(74) *Attorney, Agent, or Firm* — Seed IP Law Group LLP

(57) ABSTRACT

Provided are an electric shock protection device and a mobile electronic apparatus including the same. The electric shock protection device is disposed between a human contactable conductor and an internal circuit unit of an electronic device, in order to pass static electricity without causing dielectric breakdown when the static electricity is introduced from the conductor, and block a leakage electric current of an external power source introduced from a ground of the circuit unit, the following formula is satisfied: Vbr>Vin where Vbr is a breakdown voltage of the electric shock protection device, and Vin is a rated voltage of an external power source of the electronic device.

18 Claims, 8 Drawing Sheets

(51) Int. Cl.
*H02H 9/04* (2006.01)
*H05K 1/02* (2006.01)
*H01L 27/02* (2006.01)

(58) Field of Classification Search
USPC .......................................................... 361/56
See application file for complete search history.

(56) References Cited

FOREIGN PATENT DOCUMENTS

| | | |
|---|---|---|
| KR | 100573364 B1 | 4/2006 |
| KR | 100630187 B1 | 9/2006 |
| KR | 100713532 B1 | 4/2007 |
| KR | 100825418 B1 | 4/2008 |
| KR | 10-2008-0044551 A | 5/2008 |
| KR | 10-2008-0067917 A | 7/2008 |
| KR | 1020100019981 A | 2/2010 |
| KR | 1020100139075 A | 12/2010 |

* cited by examiner

ELECTRIC SHOCK PROTECTION DEVICE AND MOBILE ELECTRONIC APPARATUS INCLUDING THE SAME

CROSS-REFERENCE TO RELATED APPLICATIONS

The entire contents of Korean Patent Application Nos. 10-2014-0162863, filed on Nov. 20, 2014, 10-2014-0162808, filed on Nov. 20, 2014, and 10-2015-0094264, filed on Jul. 1, 2015, are hereby incorporated by reference.

BACKGROUND OF THE INVENTION

The present invention disclosed herein relates to an electric shock protection device and a mobile electronic apparatus including the same, and more particularly, to a electric shock protection device capable of protecting a user from a leakage electric current caused by a power source and also protecting an internal circuit from external static electricity, and a mobile electronic apparatus including the electric shock protection device.

Recently, the adaptation of a housing made of a metallic material for a portable electronic device is increasing so as to improve aesthetic impression and rigidity.

However, since the housing made of a metallic material has excellent electrical conductivity according to the characteristics of a material, an electrical path may be generated between the external housing and an internal circuit unit through a particular device or depending on portions. In particular, a metal housing and a circuit unit form a loop, and therefore when static electricity temporarily having a high voltage is applied through a conductor such as a metal housing having a large external exposure area, a circuit unit such as an IC may be damaged. Thus, measures therefor are required.

Meanwhile, a battery of the portable electronic device is generally charged by using a charger. The charger rectifies an external AC power into a DC power, and then a transformer transforms the DC power into a low DC power suitable for a portable electronic device. Herein, to enhance electrical insulation of the transformer, Y-CAPs each having a capacitor are disposed on both ends of the transformer.

However, as similar to the case of an inauthentic charger, when a Y-CAP does not have normal characteristics, a DC power may not be sufficiently blocked due to the Y-CAP. Moreover, a leakage electric current may be generated by an AC power, and the leakage electric current may flow along a ground part of a circuit.

Such a leakage electric current may also be transferred to a conductor, such as an external case of a portable electronic device, which may come into contact with the human body. As a result, a user may feel displeasure due to twinge. In severe cases, the user may be fatally wounded due to electric shock.

Accordingly, there is an increasing demand for measures for protecting a user from such the leakage electric current in a portable electronic device such as a mobile phone employing a metal case.

SUMMARY OF THE INVENTION

An object of the present invention is to provide an electric shock protection device capable of protecting an internal circuit and/or a user from external static electricity or a leakage electric current caused by an external power source, and a mobile electronic apparatus including the electric shock protection device.

According to an embodiment of the present invention, there is provided an electric shock protection device disposed between a human body contactable conductor and an internal circuit unit of an electronic device, wherein in order to pass static electricity to pass without causing dielectric breakdown when the static electricity is introduced from the conductor, and block a leakage electric current of an external power source introduced from a ground of the circuit unit, the following formula is satisfied:

$$Vbr > Vin$$

where, Vbr is a breakdown voltage of the electric shock protection device, and Vin is a rated voltage of an external power source of the electronic device.

Also, the rated voltage may be a standard rated voltage for each country.

Also, the electric shock protection device may include: a sintered body in which a plurality of sheet layers are stacked; at least one pair of internal electrodes spaced apart at a predetermined interval in the sintered body; and a pore defined between the internal electrodes.

Also, the pair of internal electrodes may be disposed on the same plane.

Also, the pore may have a discharging material layer which is coated on an inner wall to a predetermined thickness along a height direction.

Also, the pore may be provided in plurality between the pair of internal electrodes.

Also, the discharging material layer may be made of a nonconductive material including metal particles or a semiconductor material.

Also, the discharging material layer may include a first part coated along an inner wall of the pore, a second part outwardly extending from the top end of the first part, and a third part outwardly extending from the bottom end of the first part. The second part may come into contact with one of the pair of internal electrodes, and the third part may come into contact with the other of the pair of internal electrodes.

Also, the sintered body may be made of an insulator having a dielectric constant.

Also, the internal electrode may include at least any one component of Ag, Au, Pt, Pd, Ni, and Cu.

Also, the electric shock protection device may include: at least two varistor material layers in which a first varistor material layer and a second varistor material layer are alternately stacked; a plurality of first internal electrodes spaced apart at predetermined intervals (L) on the first varistor material layer; and a plurality of second internal electrodes spaced apart at predetermined intervals (L) on the second varistor material layer.

Also, the breakdown voltage (Vbr) may be a sum of unit breakdown voltages provided between the first internal electrodes and the second internal electrodes that are the most adjacent thereto.

Also, at least portion of each of the first internal electrodes and second internal electrodes may be disposed to overlap each other.

Also, each of the first internal electrodes and second internal electrodes may be disposed not to overlap each other.

Also, each of a spacing interval (L) between the first internal electrodes or the second internal electrodes is greater than the sum of a shortest distance d1 between the first internal electrodes and the second internal electrodes and a shortest distance d2 between the other neighboring first internal electrode and the second internal electrode.

Also, the first varistor material layer and the second varistor material layer may include any one of a semiconducting material including one or more of ZnO, SrTiO$_3$, BaTiO$_3$, and SiC, or any one of a Pr- and Bi-based material.

According to another embodiment of the present invention, there is provided a mobile electronic apparatus having a circuit protecting function, and the apparatus including: a human body contactable conductor; a circuit unit; and an electric shock protection device disposed between the conductor and the circuit unit, wherein in order to pass static electricity without causing dielectric breakdown when the static electricity is introduced from the conductor, and block a leakage electric current of an external power source introduced from a ground of the circuit unit, the following formula is satisfied:

$$Vbr > Vin$$

where, Vbr is a breakdown voltage of the electric shock protection device, and Vin is a rated voltage of an external power source of the electronic device.

Also, the conductor may include at least one of an antenna for communication of the electronic device with an external device, a metal case, or a conductive accessory.

Also, the metal case may partially or entirely surround a side portion of a housing of the electronic device.

Also, the metal case may surround a camera provided on a front or rear surface of a housing of the electronic device to be exposed to the outside.

According to further another embodiment of the present invention, there is provided a device disposed between a human body contactable conductor and an internal circuit unit of an electronic device. Here, a electric the electric shock protection device comprising an electric shock protection unit for passing static electricity without causing dielectric breakdown when the static electricity is introduced from the conductor, and blocking a leakage electric current of an external power source introduced from a ground of the circuit unit, the following formula is satisfied:

$$Vbr > Vin$$

where, Vbr is a breakdown voltage of the electric shock protection unit, and Vin is a rated voltage of an external power source of the electronic device.

Also, the electric shock protection unit may include: a sintered body in which a plurality of sheet layers are stacked; at least one pair of internal electrodes spaced apart at a predetermined interval in the sintered body; and a pore defined between the internal electrodes.

Also, the electric shock protection unit may include: at least two varistor material layers in which a first varistor material layer and a second varistor material layer are alternately stacked; a plurality of first internal electrodes spaced apart at predetermined intervals (L) on the first varistor material layer; and a plurality of second internal electrodes spaced apart at predetermined intervals (L) on the second varistor material layer.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
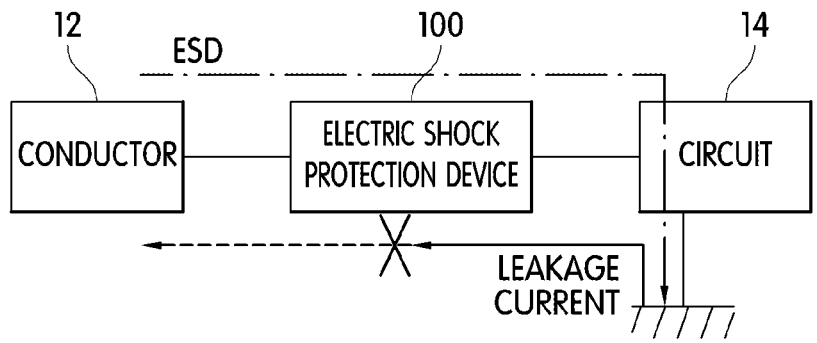
FIG. 1 is a block diagram schematically illustrating an electric shock protection device according to an embodiment of the present invention.

Hereinafter, exemplary embodiments of the present invention will be described below in more detail with reference to the accompanying drawings, thereby enabling a person of ordinary skill in the art to carry out the invention. The present invention may, however, be embodied in different forms and should not be construed as being limited to the embodiments set forth herein. Parts that are not related to description have been omitted for clarity of illustration, and the same reference numerals or symbols are used for the same or similar components throughout the specification.

An electric shock protection device 100 according to an embodiment of the present invention, as illustrated in FIG. 1, may be disposed between a human body contactable conductor 12 and an internal circuit unit 14 in an electronic device.

The electric shock protection device 100 may have a breakdown voltage (Vb) satisfying the formula below, in order to passes static electricity without causing dielectric breakdown when the static electricity is introduced from the conductor, and block a leakage electric current of an external power source introduced from the ground of the circuit unit 14, $$Vbr > Vin$$

where Vin is a rated voltage of an external power source of the electronic device.

The rated voltage may be a standard rated voltage for each country, for example, any one of 240V, 110V, 220V, 120V, and 100V.

The electric shock protection device 100 may be a varistor or a suppressor. Then, the breakdown voltage (Vbr) means a breakdown voltage (or a trigger voltage) of the varistor or suppressor and may be determined according to an interval between internal electrodes, an area of overlapping internal electrodes, a dielectric constant of a stacked sheet layer, a pore volume between the internal electrodes, and a discharging material layer of the varistor or suppressor; a particle size of a varistor material; or the number of serially connected internal electrodes.

Figure 2A:
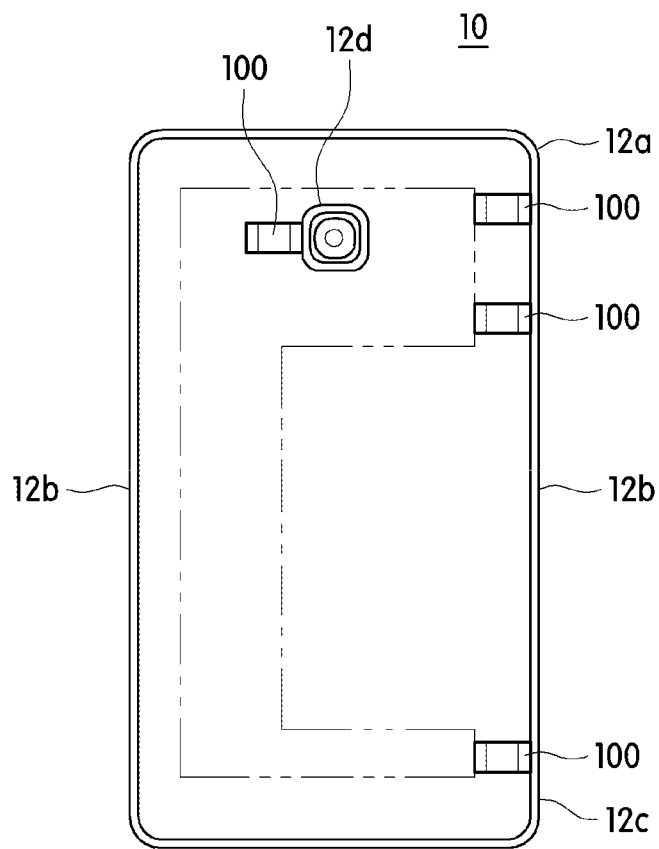
FIGS. 2A and 2B are conceptual diagrams illustrating application examples of an electric shock protection device according to an embodiment of the present invention.

The electric shock protection device 100, as illustrated in FIG. 2A, may be disposed between the conductor 12 such as an external metal case and the circuit unit 14 in a mobile electronic apparatus 10.

Here, the mobile electronic apparatus 10 may be provided as a mobile electronic apparatus that is portable and easily carried. For example, the mobile electronic apparatus may be a mobile terminal, such as a smart phone or may be a cellular phone, a smart watch, a digital camera, DMB, an electronic book, a netbook, a tablet PC, or a mobile computer. Such electronic devices may have any suitable electronic components including antenna structures for communication with an external device. In addition, the mobile electronic apparatus may use local area network communication such as Wi-Fi and Bluetooth.

The mobile electronic apparatus 10 may include an external housing made of conductive materials such as metals (aluminum, stainless steel, and the like), a carbon-fiber composite material, or other fiber-based composite materials, glass, a ceramics, plastic, and combinations thereof.

The housing of the mobile electronic apparatus 10 may include the conductor 12 which is made of metal and exposed to the outside. The conductor 12 may include at least one of an antenna for communication of the electronic device with an external device, a metal case, or a conductive accessory.

In particular, the metal case may partially or entirely surround a side portion of the housing of the electronic device. Moreover, the metal case may surround a camera which is provided on a front or rear surface of the housing of the electronic device to be exposed to the outside.

As such, the electric shock protection device 100 may be disposed between the human body contactable conductor 12 and the circuit unit 14 of the mobile electronic apparatus 10 to protect an internal circuit from a leakage electric current and static electricity.

The electric shock protection device 100 may be properly provided corresponding to the number of metal cases disposed in the housing of the mobile electronic apparatus 10. When a plurality of the metal cases are disposed, each of the metal cases 12a, 12b, 12c, and 12d may be provided in the housing of the mobile electronic apparatus 10 to be individually connected to the electric shock protection device 100.

That is, as illustrated in FIG. 2A, when the conductor 12 such as a metal case surrounding a side portion of the housing of the mobile electronic apparatus 10 is composed of three parts, each of the conductor 12a, 12b, 12c is connected to the electric shock protection device 100, and an internal circuit of the mobile electronic apparatus 10 may thus be protected from a leakage electric current and static electricity.

When the plurality of the metal cases 12a, 12b, 12c, and 12d are provided, the electric shock protection device 100 may be provided in various types corresponding to roles of the metal cases 12a, 12b, 12c, and 12d.

For example, when a camera exposed to the outside is disposed on the housing of the mobile electronic apparatus 10, and when the electric shock protection device 100 is applied to the conductor 12d surrounding the camera, the electric shock protection device 100 may be provided in a shape such that the electric shock protection device 100 blocks a leakage electric current and prevents an internal circuit from static electricity.

Moreover, when the metal case 12b serves as a ground, the electric shock protection device 100 may be provided in a shape such that the electric shock protection device 100 blocks a leakage electric current and protects an internal circuit from static electricity by being connected to the metal case 12b.

Figure 2B:
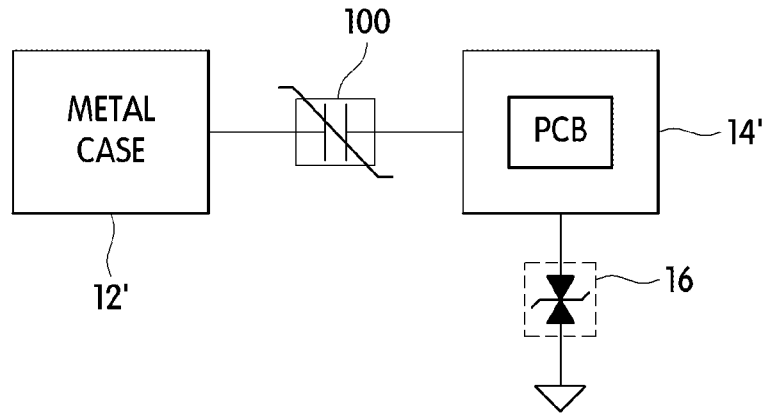

Meanwhile, as illustrated in FIG. 2B, the electric shock protection device 100 may be disposed between a metal case 12' and a circuit board 14'. Since the electric shock protection device 100 allows static electricity to pass therethrough without self damage, the circuit board 14' may include a separate protection device 16 for bypassing static electricity to the ground. Here, the protection device 16 may be a suppressor or a varistor.

Figure 3A:
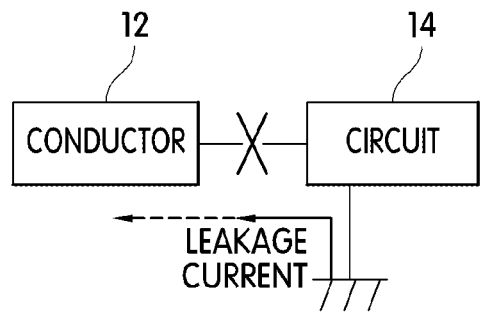
FIG. 3A is schematic equivalent circuit diagrams for describing operations of an electric shock protection device according to an embodiment of the present invention according to occurrence of a leakage electric current.
Figure 3B:
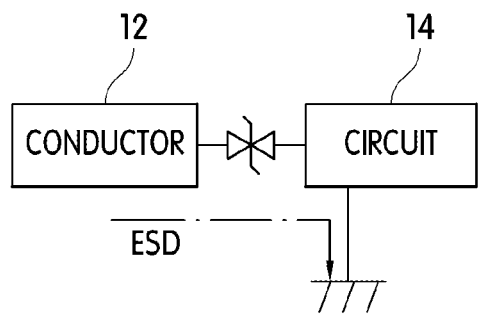
FIG. 3B is schematic equivalent circuit diagrams for describing operations of an electric shock protection device according to an embodiment of the present invention according to occurrence of electrostatic discharge (ESD)

The electric shock protection device 100, as illustrated in FIG. 3A and FIG. 3B, the electric shock protection device 100 may have different functions according to a leakage electric current caused by an external power source and static electricity introduced from a conductor 12.

That is, as illustrated in FIG. 3A, when a leakage electric current is introduced to the conductor 12 of the external power source through the circuit board of a circuit unit 14, for example, a ground, the electric shock protection device 100 may be maintained opened. That is, since a breakdown voltage of the electric shock protection device 100 is greater than a rated voltage of an external power source of a mobile electronic apparatus, the electric shock protection device 100 may be maintained opened without being electrically conducted. As a result, the electric shock protection device 100 can protect a user from electric shock by blocking a leakage electric current caused by an external power source introduced from the earth of the circuit unit 14.

Furthermore, as illustrated in FIG. 3B, when static electricity is introduced from the outside through the conductor 12, the electric shock protection device 100 serves as a static electricity protection device such as a suppressor or a varistor. That is, when the electric shock protection device 100 is a varistor, the electric shock protection device 100 enables static electricity to pass therethrough because the breakdown voltage (Vbr) of the varistor is lower than the instantaneous voltage of the static electricity. In the case of a suppressor, the electric shock protection device 100 enables static electricity to pass therethrough by means of an instantaneous discharge because an operation voltage of the suppressor for discharging static electricity is lower than the instantaneous voltage of the static electricity. As a result, when the static electricity is introduced from the conductor 12, electric resistant becomes lower, and the electric shock protection device 100 may thus allow static electricity to pass therethrough without self dielectric breakdown.

Here, the circuit unit 14 may have a separate protection device for bypassing static electricity to the ground. As a result, the electric shock protection device 100 may protect an internal circuit of a rear end by passing static electricity without causing dielectric breakdown caused by the static electricity introduced from the conductor 12.

Hereinafter, various implementations of an electric shock protection device according to embodiments of the present invention will be described in more details with reference to FIGS. 4 to 6.

Figure 4A:
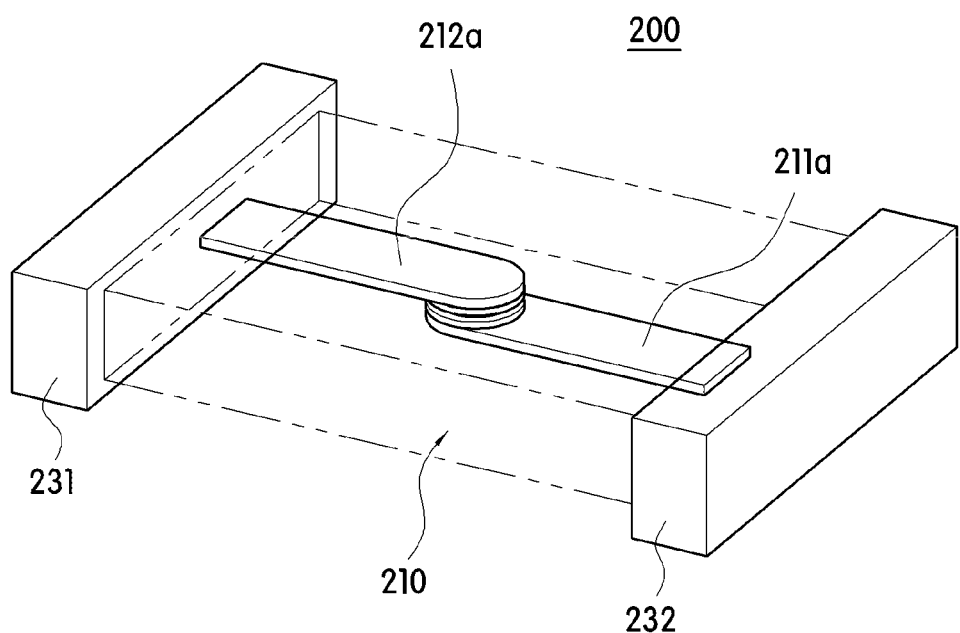
FIGS. 4A to 4C illustrate an example of an electric shock protection device according to an embodiment of the present invention.
Figure 4B:
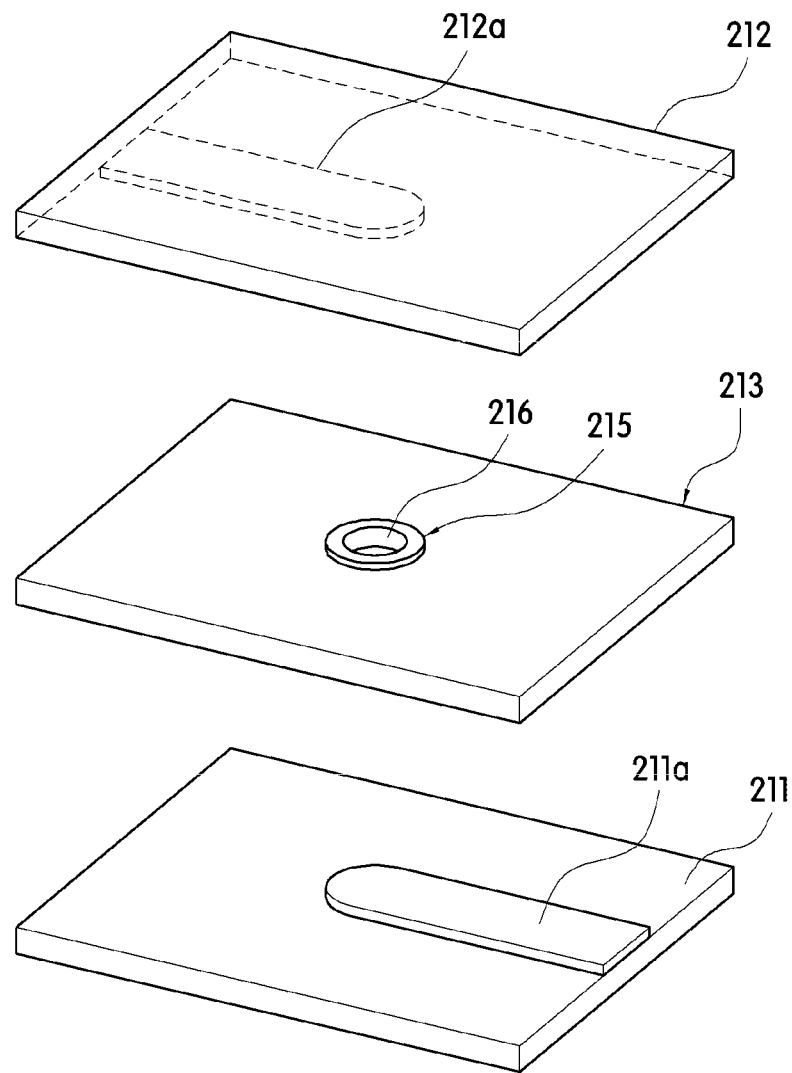
Figure 4C:
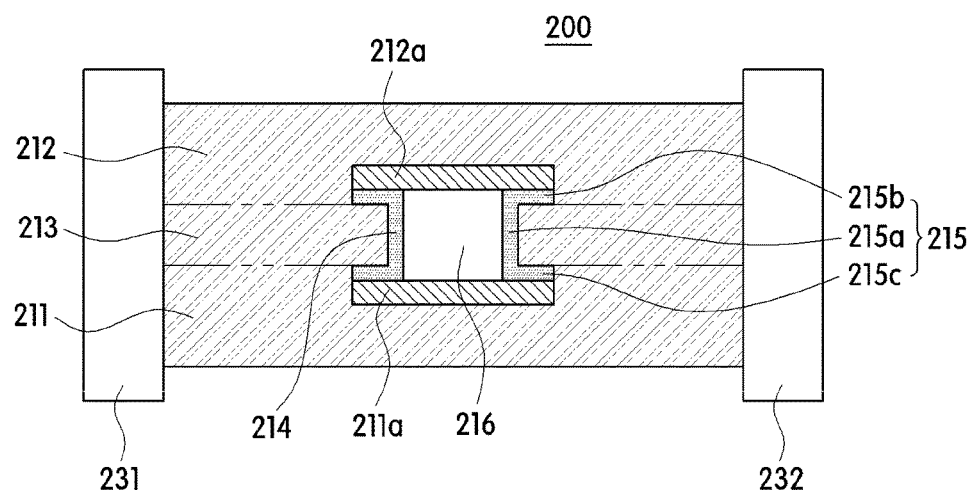

The electric shock protection device may be a suppressor 200 as illustrated in FIGS. 4A to 4C. The suppressor 200 includes a sintered body 210, internal electrodes 211a and 212a, and a pore forming member 215.

The sintered body 210 has at least one pair of sheet layers 211, 212, and 213 sequentially stacked thereon, and the internal electrodes 211a and 212a provided on one surface of each of the sheet layers are disposed to face each other and are then integrally formed through compression and calcination.

The sintered body 210 may be made of an insulator having a dielectric constant. For example, the insulator may be made of a ceramic material, low temperature sintering ceramics (LTCC), high temperature sintering ceramics (HTCC), and a magnetic material. The ceramic material is a metal-based oxide compound, and the metal-based oxide compound may include one or more selected from $Er_2O_3$, $Dy_2O_3$, $H_2O_3$, $V_2O_5$, CoO, $MoO_3$, $SnO_2$, $BaTiO_3$, and $Nd_2O_3$.

The internal electrodes 211a and 212a are spaced apart at a predetermined interval in the sintered body 210 and may be provided in at least one pair. Here, first and second internal electrodes 211a and 212a may be respectively electrically connected to external electrodes 231 and 232 provided on both ends of the sintered body 210.

The internal electrodes 211a and 212a may include any one or more components of Ag, Au, Pt, Pd, Ni, and Cu, and the external electrodes 231 and 232 may include any one or more components of Ag, Ni, and Sn.

The internal electrodes 211a and 212a may be provided in various shapes and patterns. The first internal electrode 211a and second internal electrode 212a may have the same pattern or different patterns. That is, the internal electrodes 211a and 212a are not limited to a particular pattern as long as parts of the first and second internal electrodes 211a and 212a are opposed to each other and overlapped in configuration of the sintered body 210.

An interval between the internal electrodes 211a and 212a and an opposed area therebetween or an overlapped length thereof may satisfy a breakdown voltage (Vbr) of the suppressor 200, and for example, an interval between the internal electrodes 211a and 212a may be 10-100 μm.

Meanwhile, a protection sheet layer 213 is disposed between the pair of corresponding electrodes 211a and 212a to prevent static electricity and protect a circuit protection device and peripheral circuits from an overvoltage.

The protection sheet layer 213 includes at least one hollow-shaped pore forming member 215 disposed between the pair of internal electrodes 211a and 212a. To this end, the protection sheet layer 213 may have a through-hole 214 defined in a position at which the pore forming member 215 is provided.

In particular, the sintered body 210 includes the first sheet layer 211 having the first internal electrode 211a stacked on an upper surface thereof, and the second sheet layer 212 having the second internal electrode 212a stacked on a lower surface thereof. The protection sheet layer 213 is disposed between the first sheet layer 211 and the second sheet layer 212.

That is, the first sheet layer 211, the protection sheet layer 213, and the second sheet layer 212 are sequentially stacked such that the first internal electrode 211a and the second internal electrode 212a face each other.

Accordingly, the first internal electrode 211a and the second internal electrode 212a are disposed to face each other and is then spaced apart from each other at a predetermined interval by the protection sheet layer. One side of each of the first internal electrode 211a and second internal electrode 212a comes into contact with the pore forming member 215.

Meanwhile, the protection sheet layer 213 disposed between the first sheet layer 211 and the second sheet layer 212 has at least one through-hole 214 penetrating therethrough, as illustrated in FIG. 4C.

Here, the through-hole 214 is disposed in a region where the first internal electrode 211a and the second internal electrode 212a respectively disposed over and below the protection sheet layer 213 are overlapped with each other.

The through-hole 214 may have a pore forming member 215. The pore forming member 215 is disposed between the internal electrodes 211a and 212a, and may include a discharging material layer 125a, 125b, or 125c coated on an inner wall to a predetermined thickness along a height direction.

Alternatively, when the pore forming member 215 is not separately provided, the discharging material layer may be coated on the inner wall of the through-hole 214 to a predetermined thickness along a height direction.

Here, the pore forming member 215 or the discharging material layer coated thereon has a top end contacting the second internal electrode 212a and a bottom end contacting the first internal electrodes 211a.

A pore 216 may be defined between the pair of internal electrodes 211a and 212a by means of the pore forming member 215. Static electricity introduced from the outside may be discharged between the internal electrodes 211a and 212a through the pore 216. Electric resistance between the internal electrodes 211a and 212a becomes lower, and a difference in a voltage between both ends of the electric shock protection device 100 may be reduced to be equal to or lower than a predetermined value. Accordingly, the suppressor 120 may pass static electricity without causing dielectric breakdown.

Here, a discharging material constituting the discharging material layer 125a, 125b, or 125c has a low dielectric constant and no conductivity, and short should not occur when an overvoltage is applied.

To this end, the discharging material may be made of a nonconductive material including at least one of metal particles, and may be made of a semiconducting material including a SiC— or silicon-based component. In addition, the discharging material may be with a mixture in which one or more materials selected from SiC, carbon, graphite, and ZnO and one or more materials selected from Ag, Pd, Pt, Au, Cu, Ni, W, and Mo are mixed at a predetermined ratio.

For example, when the first internal electrode 211a and the second internal electrode 212a include an Ag component, the discharging material may include a SiC—ZnO-based component. The silicon carbide (SiC) component has excellent thermal stability, good stability in an oxidation atmosphere, constant conductivity and heat conduction, and a low dielectric constant.

Furthermore, a ZnO component has excellent nonlinear resistant characteristics and discharging characteristics.

When Sic and ZnO are separately used, both have conductivity. However, when Sic and ZnO are mixed and then calcined, ZnO binds to a SiC particle surface, thereby providing an insulation layer which is a material having low conductivity.

In the insulation layer, SiC is completely reacted to provide a SiC—ZnO reaction layer on the SiC particle surface. Accordingly, the insulation layer applies higher insulation to a discharging material by blocking Ag pass and improves resistance against static electricity, thereby resolving a DC short phenomenon when the suppressor 120 is mounted on an electronic component.

Here, as an example of the discharging material, a description has been given that a SiC—ZnO-based component is included, but the discharging material is not limited thereto. A nonconductive material including metal particles or a semiconductor material corresponding to components constituting the first internal electrode 211a and second internal electrodes 212a may be used for the discharging material.

The discharging material layer 215a, 215b, or 215c coated on the inner wall of the pore forming member 215 may include a first part 215a coated along an inner wall of the pore forming member 215, a second part 215b extending to oppositely contact the first internal electrode 211a along an upper surface of the protection sheet layer 213 from the top end of the first part 215a, and a third part 215c extending to oppositely contact the second internal electrode 212a along a lower surface of the protection sheet layer 213 from the bottom end of the first part 215a.

Accordingly, the discharging material layer 215a, 215b, or 215c has the second part 215b and third part 215c respectively extending not only from the inner wall of the pore forming member 215 but also from the top end and bottom end of the pore forming member 215, thereby increasing a contact area between the first internal electrodes 211a and the second internal electrodes 212a.

By means of such a configuration, although a part of the discharging material layer 215a, 215b, or 215c is damaged because a part of components constituting the discharging material layer 215a, 215b, or 215c is gasified due to static electricity sparks, the discharging material layer 215a, 215b, or 215c may perform its own functions to thereby improve resistance against static electricity.

Meanwhile, the protection sheet layer 213 may have a plurality of pore forming members 215. Likewise, when the number of the pore forming members 215 increases, a discharge path of static electricity increases to result in an improvement on resistance against static electricity.

The protection sheet layer 213 disposed between the first sheet layer 211 and second sheet layer 212 may have the same area as the first sheet layer 211 and second sheet layer 212, but it should be noted that the protection sheet layer 213 may also have an area in which corresponding first internal electrode 211a and second internal electrode 212a are overlapped, and which is smaller than those of the first sheet layer 211 and second sheet layer 212.

When a leakage electric current caused by an external power source is applied to the suppressor 200, a breakdown voltage (Vbr) of the suppressor 200 is higher than an overvoltage caused by a leakage electric current. Therefore, the suppressor 200 is maintained opened, thereby preventing the leakage electric current from being transferred to a human body contactable conductor 12 such as a metal case.

Figure 5A:
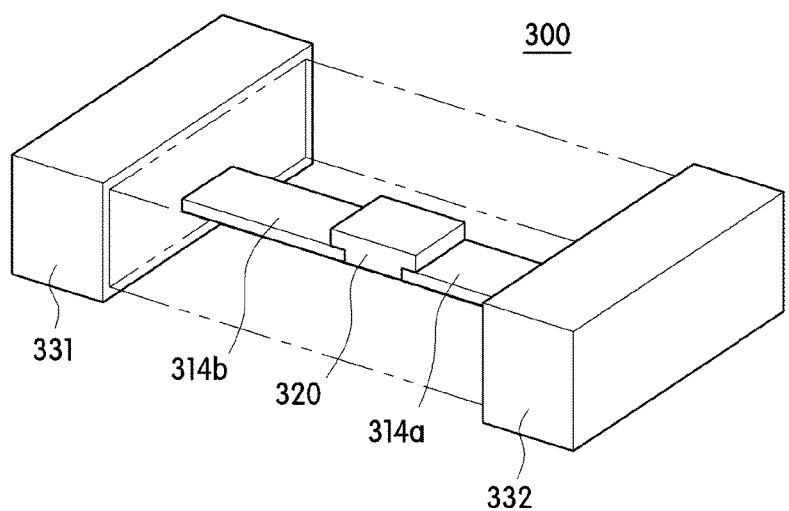
FIGS. 5A to 5C illustrate another example of an electric shock protection device according to an embodiment of the present invention.
Figure 5B:
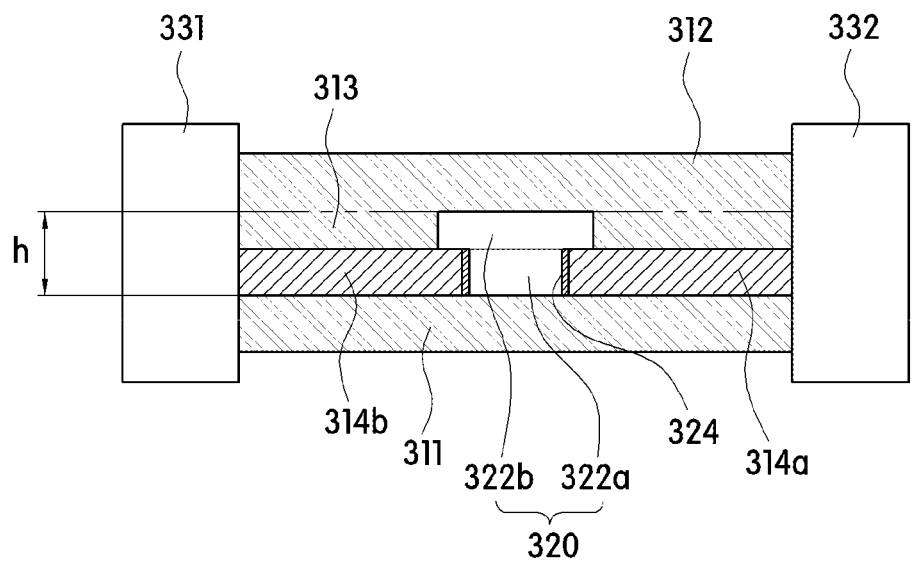
Figure 5C:
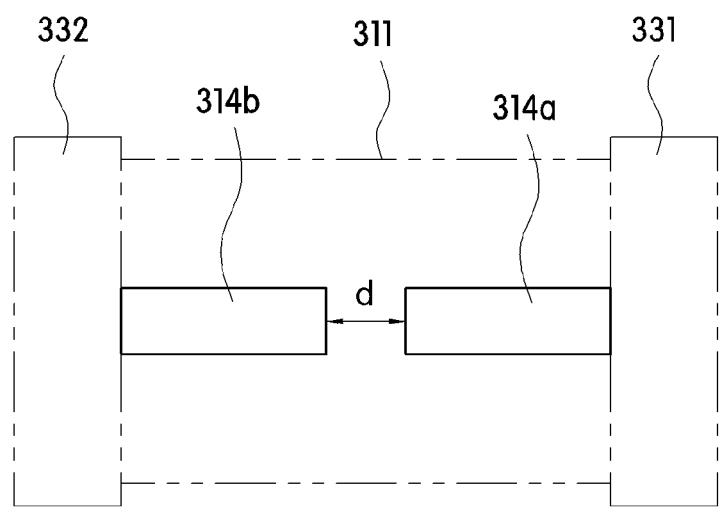

The electric shock protection device may be a suppressor 300 as illustrated in FIGS. 5A 5C. The suppressor 300 may have a pore 320 between internal electrodes 314a and 314b without using a separate pore forming member. A side wall of the pore 320 may have a discharging material layer 324.

The suppressor 300 may include a pair of internal electrodes 314a and 314b spaced apart at a predetermined interval and horizontally disposed.

Here, the pore 320 may be defined between the pair of internal electrodes 314a and 314b. Here, the pore 320 may have a higher height than the height of the pair of internal electrodes 314a and 314b and have a larger width than an interval between the pair of internal electrodes 314a and 314b. Thus when a volume of the pore 320 is extended, although fine particles are generated from the internal electrodes 314a and 314b during a discharge caused by static electricity, a rate of the occurrence of defects caused by particles may be reduced because a space between the internal electrodes 314a and 314b is wide.

In particular, the internal electrodes 314a and 314b are spaced apart from each other to define a pore in the sintered body including at least one pair of sheet layers 311, 312, and 313. Preferably, the pair of internal electrodes 314a and 314b are spaced apart at a predetermined interval in a horizontal direction on the same plane.

That is, the pair of internal electrodes 314a and 314b are spaced apart from each other to provide a gap d on an upper surface of the first sheet layer 111. Here, the gap d between the pair of internal electrodes 314a and 314b may be 10-100 μm. The pair of internal electrodes 314a and 314b are pattern-printed on an upper surface of the first sheet layer 111.

The pore 320 is provided between the pair of internal electrodes 314a and 314b to prevent static electricity, protect a circuit protection device and peripheral circuits from an overvoltage, and block a leakage electric current.

The pore 320 is disposed between the pair of internal electrodes 314a and 314b horizontally disposed with each other on the same plane, and is provided in a hollow shape to allow air to be filled therein, and the second sheet layer 312 is stacked on an opened upper side of the pore 320.

The pore 320 may be provided in plurality and spaced apart along a width direction of the internal electrodes 314a and 314b. Thus, when the number of the pore 320 increases, a discharge path of static electricity increases, to lead to an improvement on resistance against static electricity.

The pore 320 has a height (h) exceeding a height from an upper surface of the first sheet layer 111 to a top end of the internal electrodes 314a and 314b. That is, the pore 320 according to an embodiment of the present invention has a height exceeding the overall height of the internal electrodes 314a and 314b, so that an overall volume of the pore 320 may be extended.

Accordingly, although fine particles are generated from the internal electrodes 314a and 314b during discharge of static electricity, a rate of the occurrence of defects caused by particles may be reduced through the pore 320 having a wide space.

Here, the pore 320 includes a first part 322a having the same height as the internal electrodes 314a and 314b, and a second part 322b extending to a predetermined height from a top end of the first part 322a. The second part 322b of the pore 320, as illustrated in FIG. 5B, may extend onto an upper surface of at least one of the pair of internal electrodes 314a and 314b spaced apart from each other, and may extend onto upper surfaces of the pair of internal electrodes 314a and 314b.

In addition, the pore 320 includes a third part downwardly extending to a predetermined height from a bottom end of the first part 322a, and the pore 320 may have a shape in which the third part extends onto a lower surface of the internal electrodes 314a and 314b.

The pore 320 is provided by pattern-printing a pore material on the gap d and removing the pore material through heat applied during a sintering step. Here, the pore material is used to prevent deformation or damage applied to the pore 320 due to pressure during a step of laminating and compressing a first sheet layer 311 and a second sheet layer 312 to produce a sintered body.

To this end, the pore material is made of a material decomposable by high-temperature heat, and may be removed during calcination after a plurality of sheet layers are stacked. For example, the pore material may be made of a material which is decomposed in a temperature range of approximately 200 to 2000° C.

The pair of internal electrodes 314a and 314b, as illustrated in FIG. 5C, may be provided in a bar shape having a rectangular cross section, are not limited thereto. Thus, the internal electrodes 314a and 314b may be provided in various shapes and patterns, and may be provided in the same pattern or in different patterns.

Meanwhile, a gap d is spaced at a predetermined interval between ends where the pair of internal electrodes 314a and 314b face each other, and the pore 320 is provided in the gap d. A discharging material layer 324 is coated to a predetermined thickness along a height direction of the internal electrodes 314a and 314b on an inner wall of the pore 320. The discharging material layer 324 may be provided only on the inner wall of the pore 320, but it should be noted that the discharging material layer 324 may also be coated so as to cover an open upper part of the pore 320. That is, the discharging material layer 124 may extend not only from the inner wall of the pore 320 but also from the connected open upper end of the pore 320.

Meanwhile, in the first sheet layer 111 and second sheet layer 312 constituting the sintered body, the second sheet layer 312 may be directly stacked on an upper part of the first sheet layer 111, but a separate buffer layer 113 having a thickness corresponding to heights of the pair of internal electrodes 314a and 314b and pore 320 provided on an upper surface of the first sheet layer 111 may be stacked. The buffer layer 113 plays a role in minimizing a height deviation corresponding to the height of the internal electrodes 314a and 314b and the height of the pore 320.

The electric shock protection device may be a varistor 400 as illustrated in FIGS. 6A to 6d. The varistor 400 includes a varistor material layer 410 or 420 and a plurality of internal electrodes 412, 412', and 422.

The varistor material layer may be made of at least two alternate layers that are a first varistor material layer 410 and a second varistor material layer 420. Here, the first varistor material layer 410 and the second varistor material layer 420 may be made of any one of a semiconducting material including one or more of $ZnO$, $SrTiO_3$, $BaTiO_3$, and $SiC$, or any one of a Pr- and Bi-based material.

The internal electrodes may include a plurality of first electrodes 412 and 412' spaced apart at predetermined intervals (L) on the first varistor material layer 410, and a plurality of second electrodes 422 spaced apart at predetermined intervals (L) on the second varistor material layer 420.

Here, the breakdown voltage (Vbr) of the varistor 400 may be the sum of unit breakdown voltages respectively provided between the first internal electrodes 412 and 412' and the second internal electrodes 422 that are most adjacent thereto. That is, the breakdown voltage (Vbr) of the varistor 400 may be determined according to unit breakdown voltages respectively provided between the first internal electrodes 412 and 412' and the second internal electrodes 422, and the number of first internal electrodes 412 and 412' and second internal electrodes 422 that are electrically linearly provided.

Each of the first internal electrodes 412 and 412' and each of the second internal electrodes 422 may be disposed not to be at least partially overlapped. That is, each of the first internal electrodes 412 and 412' and each of the second internal electrodes 422 may cross each other such that they are at least partially overlapped, or may cross between each other such that they are not overlapped with each other.

The first or second internal electrode has an interval which is set such that static electricity or a leakage electric current is not leaked to an external electrode (not shown) adjacent to the internal electrodes 412, 412', and 422 but normally flows between the internal electrodes 412, 412', and 422.

For example, it is preferable that a spacing interval (L) between one of the first internal electrode 412 and one of the neighboring first internal electrode 412' is greater than the sum of a shortest distance d1 between the first internal electrode 412 and the second internal electrode 422 and a shortest distance d2 between the other neighboring first internal electrode 412' and the second internal electrode 422.

In addition, it is preferable that a distance between the second internal electrodes 422 and an external electrode (not shown) adjacent thereto is greater than a spacing interval between the first internal electrodes 412 and 422.

In particular, the first varistor material layer 410 may have two first internal electrodes 412 and 412', and the two first internal electrodes 412 and 412' may be spaced apart in parallel on the same plane.

Moreover, the second varistor material layer 420 may have a second internal electrode 422 disposed on one surface thereof.

The first varistor material layer 410 and the second varistor material layer 420 are stacked vertically such that the second internal electrode 422 may be spaced apart at a predetermined interval vertically with respect to the two first internal electrodes 412 and 412'.

Furthermore, both end sides of the second internal electrode 422 may be disposed to have a predetermined region overlapped with one end side of the two first internal electrodes 412 and 412'. To this end, a central portion of the second internal electrode 422 may be positioned in a central portion of a gap (L1) provided between the two first internal electrodes 412 and 412'.

Figure 6A:
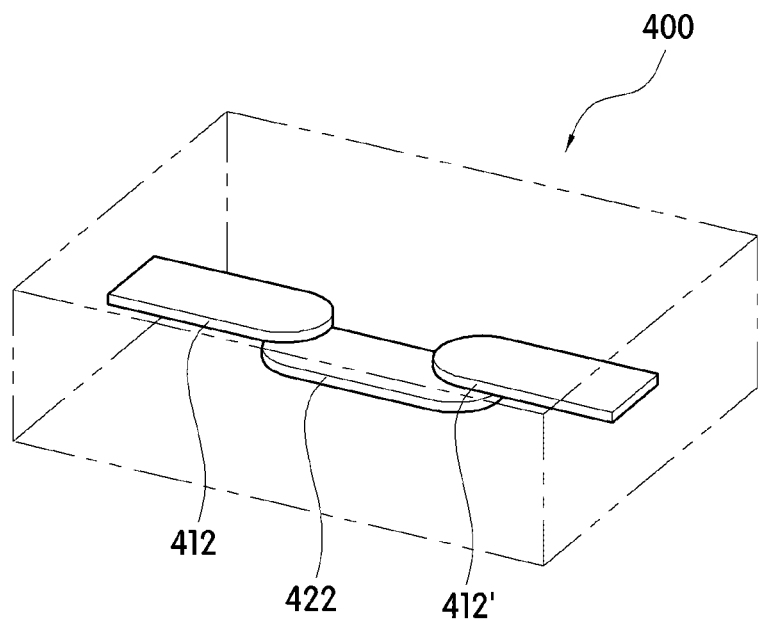
FIGS. 6A to 6D illustrate still another example of an electric shock protection device according to an embodiment of the present invention.
Figure 6B:
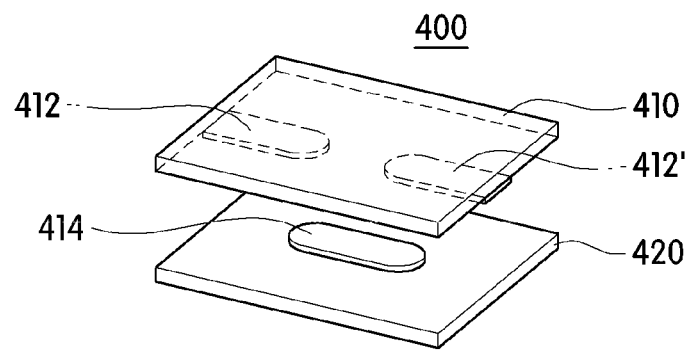
Figure 6C:
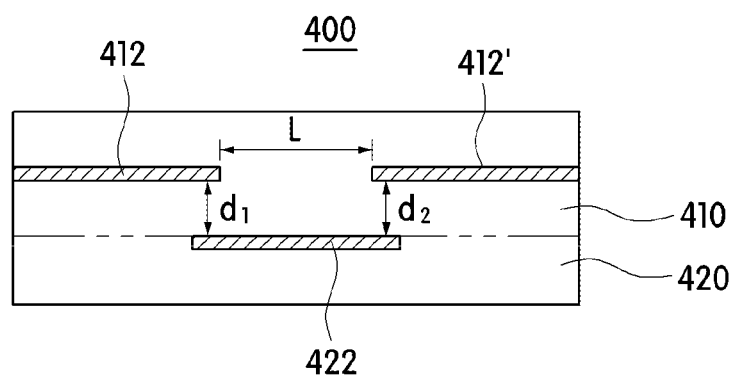

Here, the first varistor material layer 410 having the two first internal electrodes 412 and 412' provided therein, as illustrated in FIG. 6C, may be stacked in an upper part of the second varistor material layer 420 having the second internal electrode 422 formed therein, and may be selectively stacked in a lower part of the second varistor material layer 420.

Meanwhile, the number of the first internal electrodes 412 and 412' and the number of second internal electrode 422 may be determined according to unit breakdown voltages provided therebetween, so as to satisfy a breakdown voltage (Vbr) of the varistor 400. That is, it has been described in FIGS. 6A to 6D that there are two unit devices formed by the first internal electrodes 412 and 412' and the second internal electrodes 422. However, the present invention is not limited thereto but may be provided in plurality according to the magnitude of a unit breakdown voltage.

Figure 6D:
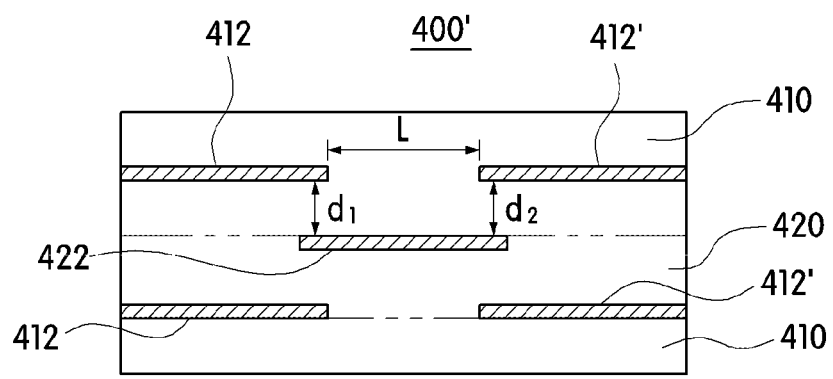

A plurality of unit devices formed by the first internal electrodes 412 and 412' and second internal electrodes 422 may be y provided in parallel. That is, as illustrated in FIG. 6D, the varistor 400' may have a shape in which the two first varistor material layers 410 having the two first internal electrodes 412 and 412' formed therein and the second varistor material layer 420 having the single second internal electrode 422 formed therein are alternately stacked.

The two first varistor material layer 410 may be respectively stacked on an upper part and a lower part of the second varistor material layer 420. Here, both end sides of the second internal electrode 422 provided in the second varistor material layer 420 are respectively disposed to have a particular region overlapped with the first internal electrodes 412 and 412' disposed in an upper part thereof and one end side of the second internal electrodes 422 disposed in a lower part thereof.

The first internal electrodes 412 and 412' disposed in an upper part of the second varistor material layer 420 and the first internal electrodes 412 and 412' disposed in a lower part of the second varistor material layer 420 may be disposed in parallel vertically, and the second internal electrode 422 may be disposed between the first internal electrodes 412 and 412' spaced apart vertically.

A central portion of the second internal electrode 422 may be disposed in a central portion of a gap (L) provided between the two first internal electrodes 412 and 412' disposed on the same plane.

The first varistor material layer 410 and second varistor material layer 420 may be disposed in various lamination sequences while satisfying the above-described gap d1 or interval L between the first internal electrodes 412 and 412' and the second internal electrode 422.

As described above, since the first varistor material layer 410 and second varistor material layer 420 are stacked in plurality, a discharge path of static electricity increases, and resistance against static electricity may be improved.

The varistor 400 or 400' has the first internal electrodes 412 and 412' and second internal electrode 422 in the varistor material layer. Thus, when static electricity is applied, electric resistance between the first internal electrodes 412 and 412' and the second internal electrode 422 becomes lower through the nonlinear voltage characteristics of a varistor material, thereby allowing static electricity to pass therethrough. Accordingly, the varistor material may allow static electricity to pass therethrough without causing dielectric breakdown even when temporarily high static electricity is applied.

Meanwhile, when a leakage electric current caused by an external power source is applied, a breakdown voltage (Vbr) of the varistor 400 or 400' is greater than an overvoltage caused by a leakage electric current. Therefore, an opened state is maintained opened, thereby preventing the leakage electric current from being transferred to a human contactable conductor 12 such as a metal case.

In accordance with an electric shock protection device and a mobile electronic apparatus including the same according to embodiment of the present invention, an electric shock protection device for connecting a connector and a circuit unit is provided in a mobile electronic apparatus in which a conductor such as a metal case is exposed to the outside, thereby advantageously protecting a user and an internal circuit from static electricity and a leakage electric current caused by an external power source.

Descriptions above have been made for embodiment of the present invention, but the spirit of the present invention is not restrictive to the embodiments disclosed in the specification. Other embodiments can be easily proposed through supplementations, modifications, deletions, and additions in the similar scope of the spirit in the present invention by those skilled in the art, but are to be considered in the scope of the spirit in the present invention.

What is claimed is:

1. An electric shock protection device for connecting between a human body contactable conductor and an internal circuit unit of an electronic device, and passing static electricity by being electrically conducted without causing dielectric breakdown when the static electricity is introduced from the conductor, and blocking a leakage electric current of an external power source by being maintained opened without being electrically conducted when the leakage electric current of the external power source is introduced from a ground of the circuit unit, and
wherein the electric shock protection device comprises:
a sintered body in which a plurality of sheet layers comprising a protection sheet layer are stacked;
at least one pair of internal electrodes spaced apart at a predetermined interval, each internal electrode in a pair of internal electrodes disposed on a different sheet layer of the plurality of sheet layers;
a pore defined on the protection sheet layer disposed between the internal electrodes; and
a discharging material layer formed in the pore,
wherein the discharging material layer comprises a first part coated along an inner wall of the pore to a predetermined thickness along a height direction, the first part having a top end and a bottom end, a second part outwardly extending from the top end of the first part along an upper surface of the protection sheet layer, and a third part outwardly extending from the bottom end of the first part along a lower surface of the protection sheet layer,
the second part coming into contact with one internal electrode of the at least one pair of internal electrodes, and
the third part coming into contact with another one of the internal electrodes of the at least one pair of internal electrodes.

2. The electric shock protection device of claim 1, wherein the following formula is satisfied, $$Vbr > Vin$$

where, Vbr is a breakdown voltage of the electric shock protection device, and Vin is a rated voltage of an external power source of the electronic device; and
the rated voltage is a standard rated voltage for each country.

3. The electric shock protection device of claim 1, wherein the pore is provided in plurality between the pair of internal electrodes.

4. The electric shock protection device of claim 1, wherein the discharging material layer is made of a non-conductive material including metal particles or a semiconductor material.

5. The electric shock protection device of claim 1, wherein the sintered body is made of an insulator having a dielectric constant.

6. The electric shock protection device of claim 1, wherein the internal electrode comprises at least any one component of Ag, Au, Pt, Pd, Ni, and Cu.

7. An electric shock protection device for connecting between a human body contactable conductor and an internal circuit unit of an electronic device,
wherein in order to pass static electricity by being electrically conducted without causing dielectric breakdown when the static electricity is introduced from the conductor, and block a leakage electric current of an external power source by being maintained opened without being electrically conducted when the leakage electric current of the external power source is introduced from a ground of the circuit unit, the following formula is satisfied:

$$Vbr > Vin$$

where, Vbr is a breakdown voltage of the electric shock protection device, and Vin is a rated voltage of an external power source of the electronic device, and
wherein the electric shock protection device comprises:
at least two varistor material layers in which a first varistor material layer and a second varistor material layer are alternately stacked;

a plurality of first internal electrodes spaced apart at predetermined intervals (L) on the first varistor material layer; and
a plurality of second internal electrodes spaced apart at predetermined intervals (L) on the second varistor material layer.

8. The electric shock protection device of claim 7, wherein the breakdown voltage (Vbr) is a sum of unit breakdown voltages provided between the first internal electrodes and the second internal electrodes that are the most adjacent thereto.

9. The electric shock protection device of claim 7, wherein at least portion of each of the first internal electrodes and second internal electrodes is disposed to overlap each other.

10. The electric shock protection device of claim 7, wherein each of the first internal electrodes and the second internal electrodes is disposed not to be overlapped with each other.

11. The electric shock protection device of claim 7, wherein a spacing interval (L) between the first internal electrodes or the second internal electrodes is greater than the sum of a shortest distance d1 between the first internal electrodes and the second internal electrodes and a shortest distance d2 between the other neighboring first internal electrode and the second internal electrode.

12. The electric shock protection device of claim 7, wherein the first varistor material layer and the second varistor material layer includes any one of a semiconducting material including one or more of $ZnO$, $SrTiO_3$, $BaTiO_3$, and $SiC$, or any one of a Pr- and Bi-based material.

13. A mobile electronic apparatus having an electric shock protecting function, the apparatus comprising:
a human body contactable conductor;
a circuit unit; and
an electric shock protection device for connecting between the conductor and the circuit unit, and passing static electricity by being electrically conducted without causing dielectric breakdown when the static electricity is introduced from the conductor, and blocking a leakage electric current of an external power source by being maintained opened without being electrically conducted when the leakage electric current of the external power source is introduced from a ground of the circuit unit,
wherein the electric shock protection device comprises:
a sintered body in which a plurality of sheet layers comprising protection sheet layer are stacked;
at least one pair of internal electrodes spaced apart at a predetermined interval, each internal electrode in a pair of internal electrodes disposed on a different sheet layer of the plurality of sheet layers;
a pore defined on the protection sheet layer disposed between the internal electrodes; and
a discharging material layer formed in the pore,
wherein the discharging material layer comprises a first part coated along an inner wall of the pore to a predetermined thickness along a height direction, the first part having a top end and a bottom end, a second part outwardly extending from the top end of the first part along an upper surface of the protection sheet layer, and a third part outwardly extending from the bottom end of the first part along a lower surface of the protection sheet layer,
the second part coming into contact with one internal electrode of the at least one pair of internal electrodes, and
the third part coming into contact with another one of the internal electrodes of the at least one pair of internal electrodes.

14. The mobile electronic apparatus of claim 13, wherein the conductor comprises at least one of an antenna for communication of the electronic device with an external device, a metal case, or a conductive accessory.

15. The mobile electronic apparatus of claim 14, wherein the metal case partially or entirely surrounds a side portion of a housing of the electronic device.

16. The mobile electronic apparatus of claim 14, wherein the metal case surrounds a camera provided on a front or rear surface of a housing of the electronic device to be exposed to the outside.

17. An electric shock protection device for connecting between a human body contactable conductor and an internal circuit unit of an electronic device, the electric shock protection device comprising an electric shock protection unit for passing static electricity by being electrically conducted without causing dielectric breakdown when the static electricity is introduced from the conductor, and blocking a leakage electric current of an external power source by being maintained opened without being electrically conducted when the leakage electric current of the external power source is introduced from a ground of the circuit unit, the following formula is satisfied:

$$Vbr > Vin$$

where, Vbr is a breakdown voltage of the electric shock protection unit, and Vin is a rated voltage of an external power source of the electronic device,
wherein the electric shock protection unit comprises:
at least two varistor material layers in which a first varistor material layer and a second varistor material layer are alternately stacked;
a plurality of first internal electrodes spaced apart at predetermined intervals (L) on the first varistor material layer; and
a plurality of second internal electrodes spaced apart at predetermined intervals (L) on the second varistor material layer.

18. A mobile electronic apparatus having an electric shock protecting function, the apparatus comprising:
a human body contactable conductor;
a circuit unit; and
an electric shock protection device for connecting between the conductor and the circuit unit,
wherein in order to pass static electricity by being electrically conducted without causing dielectric breakdown when the static electricity is introduced from the conductor, and block a leakage electric current of an external power source by being maintained opened without being electrically conducted when the leakage electric current of the external power source is introduced from a ground of the circuit unit, the following formula is satisfied, $$Vbr > Vin$$

where, Vbr is a breakdown voltage of the electric shock protection device, and Vin is a rated voltage of an external power source of the electronic device, and
wherein the electric shock protection unit comprises:
at least two varistor material layers in which a first varistor material layer and a second varistor material layer are alternately stacked;

a plurality of first internal electrodes spaced apart at predetermined intervals (L) on the first varistor material layer; and
a plurality of second internal electrodes spaced apart at predetermined intervals (L) on the second varistor material layer.

* * * * *